United States Patent [19]

Barrow

[11] Patent Number: 5,812,379
[45] Date of Patent: Sep. 22, 1998

[54] SMALL DIAMETER BALL GRID ARRAY PAD SIZE FOR IMPROVED MOTHERBOARD ROUTING

[75] Inventor: Michael Barrow, El Dorado Hills, Calif.

[73] Assignee: Intel Corporation, Santa Clara, Calif.

[21] Appl. No.: 696,058

[22] Filed: Aug. 13, 1996

[51] Int. Cl.⁶ .................................. H01R 9/09; H05K 7/06
[52] U.S. Cl. .......................... 361/773; 174/260; 257/738; 257/778; 361/760; 361/777; 361/779
[58] Field of Search .................................... 174/260, 261, 174/262, 263, 52.4; 228/180.22; 257/738, 778, 779, 700, 723, 724, 780, 692; 361/760, 772, 773, 777, 779, 780, 783, 792–795; 439/68, 83, 82; 437/209, 211; 438/108, 612, 613, 617, 125, 126, 129

[56] References Cited

U.S. PATENT DOCUMENTS

| 3,871,014 | 3/1975 | King et al. .............................. 257/780 |
| 3,871,015 | 3/1975 | King et al. .............................. 257/780 |
| 4,673,772 | 6/1987 | Satoh et al. ............................. 174/52.4 |
| 4,878,611 | 11/1989 | LoVasco et al. .................... 228/180.22 |
| 5,641,946 | 6/1997 | Shim ....................................... 174/261 |

*Primary Examiner*—Donald Sparks
*Attorney, Agent, or Firm*—Blakely, Sokoloff, Taylor & Zafman

[57] ABSTRACT

A solder joint interface which includes a plurality of solder balls that attach an integrated circuit package to corresponding pads of a printed circuit board. The solder pads are on a 0.05 inch pitch and have a diameter of 0.02 inches so that two 0.006 inch routing traces can be routed between adjacent pads of the circuit board. The additional routing traces allow the solder pads to be arranged in a pattern that has five rows of solder pads. The solder balls have pre-assembled diameters of 0.030 inches and a final height of 0.02 inches. The relatively tall solder joints function as structural beams that undergo both shear and moment stresses when an external load is applied to the joints. The moment component produces lower solder stresses and improves the structural integrity of the solder joints.

9 Claims, 2 Drawing Sheets

SMALL DIAMETER BALL GRID ARRAY PAD SIZE FOR IMPROVED MOTHERBOARD ROUTING

BACKGROUND OF THE INVENTION

1. Field of the Invention

The present invention relates to a printed circuit board assembly.

2. Description of Related Art

Integrated circuits (ICs) are typically assembled into a package that is soldered to a printed circuit board commonly referred to as a "motherboard". The package may have a plurality of solder balls that are soldered to corresponding solder pads of the motherboard. IC packages which have external solder balls are commonly referred to as ball grid array (BGA) packages. The solder pads of the printed circuit board are coupled to routing traces that connect the integrated circuit to other devices attached to the motherboard. The routing traces can be constructed internally or on the top surface of the printed circuit board.

The input/output (I/O) signals of an integrated circuit package are limited to the number of solder pads which can be constructed on the surface of the printed circuit board. Generally speaking it is desirable to increase the number of solder balls and corresponding I/O. It is also desirable to reduce the footprint dimensions of the IC package to decrease the size of the overall system and lower the cost of producing the package. A larger number of I/O pins requires either higher routing densities on the circuit board, or an additional routing layer within the board. Adding routing layers is undesirable because of the increased cost and reduced yield in producing multi-layered boards. Furthermore, internal routing layers require vias that increase the cost of producing the board. It is therefore desirable to increase the routing density on the top surface of the board.

BGA mounted motherboards of the prior art contain groups of solder pads that are arranged in a rectangular matrix of rows and columns. The solder pads are typically 0.025 inches in diameter and are located on 0.05 inch centers. The 0.025 inch solder pads only allow a single 0.008 inch wide trace to be routed between adjacent solder balls on the top surface of the printed circuit board. The restriction of a single routing trace limits the number of solder pads that can be formed on the board and the number of I/O pins for the package. Conventional BGA motherboards are typically limited to patterns which have four rows of solder pads.

The routing density can be increased by reducing the width of the traces or the diameter of the solder pads. Thinner routing traces decrease the yield and increase the cost of producing the motherboard. Reducing the size of the solder pads decreases the diameter of the solder joints. The smaller solder joints tend to crack and fail at lower shear loads and shorter fatigue cycles. It would be desirable to provide a solder joint interface which is structurally rugged and allows more than one trace to be routed between the solder pads of a printed circuit board.

SUMMARY OF THE INVENTION

The present invention is an electronic package assembly which contains a plurality of solder balls that attach an integrated circuit package to corresponding solder pads of a printed circuit board. The solder pads are located on a 0.05 inch pitch and have a diameter of 0.02 inches so that two 0.006 inch routing traces can be routed between adjacent pads of the circuit board. The additional routing traces allow the solder pads to be arranged in a pattern that has five rows of solder pads, thereby increasing the input/output (I/O) density of the integrated circuit package. The solder balls have pre-assembled diameters of 0.030 inches and a final height of 0.02 inches. The relatively tall solder joints function as structural beams that undergo both shear and moment stresses when an external load is applied to the joints. The moment component produces lower solder stresses and maintains the structural integrity of the solder joints.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
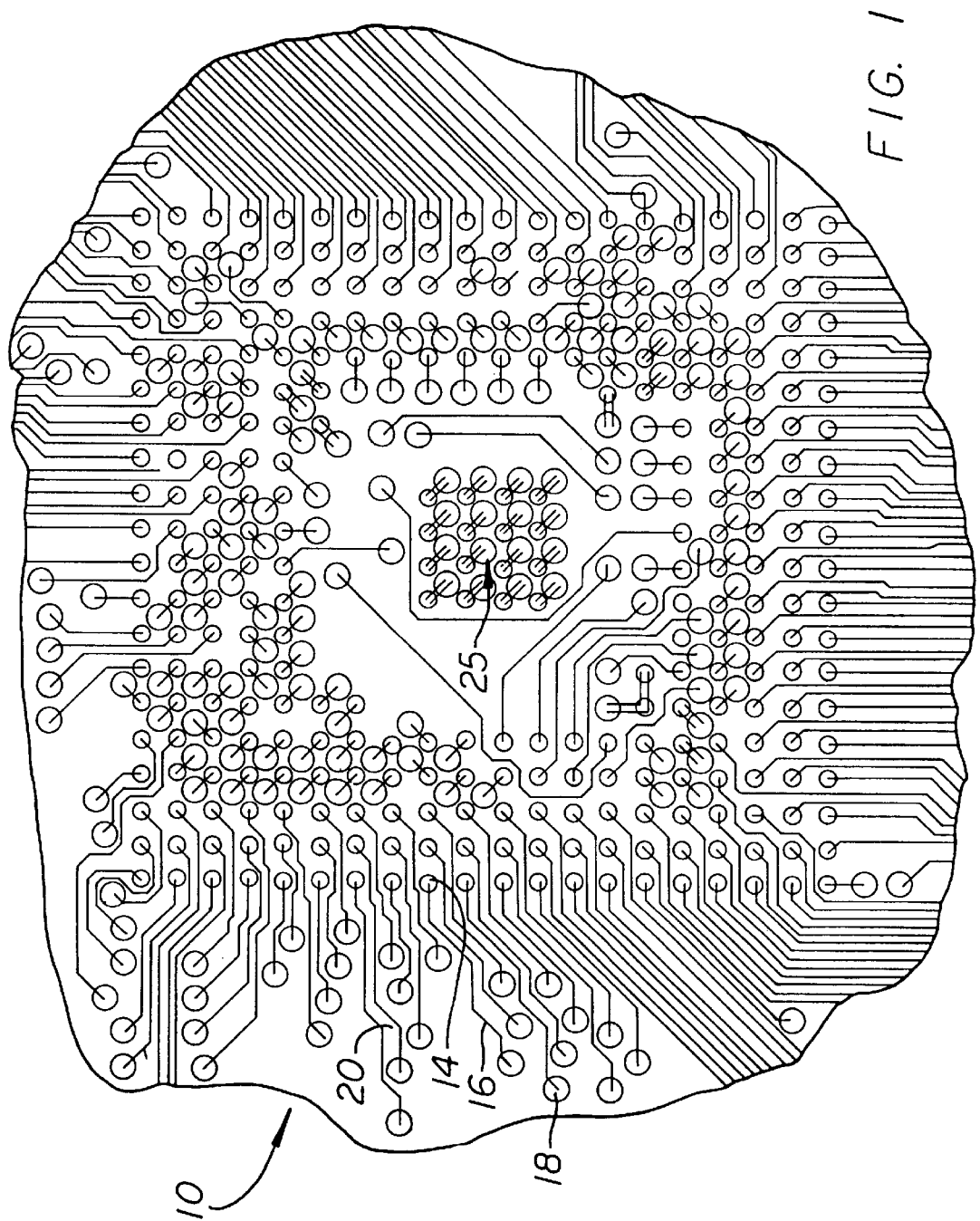
FIG. 1 is a top view of a motherboard of the present invention.
Figure 2:
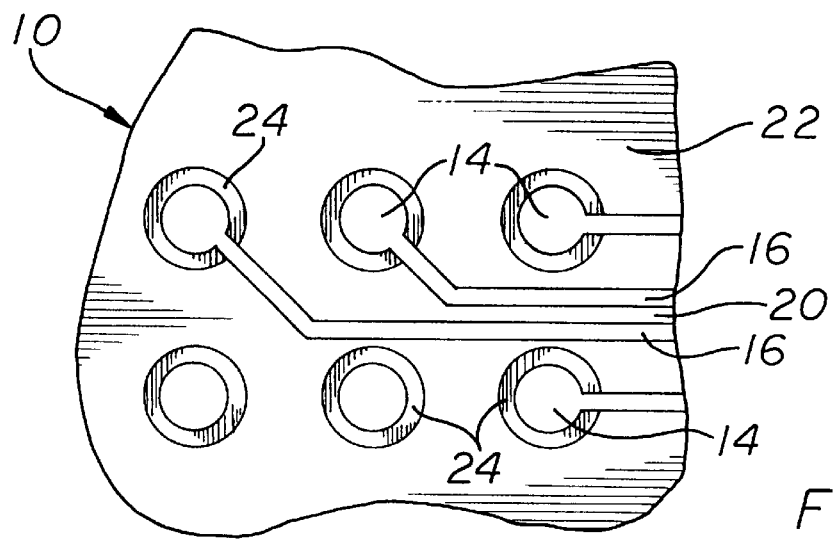
FIG. 2 is an enlarged view showing a pair of routing traces that extend between adjacent solder pads of the motherboard.
Figure 3:
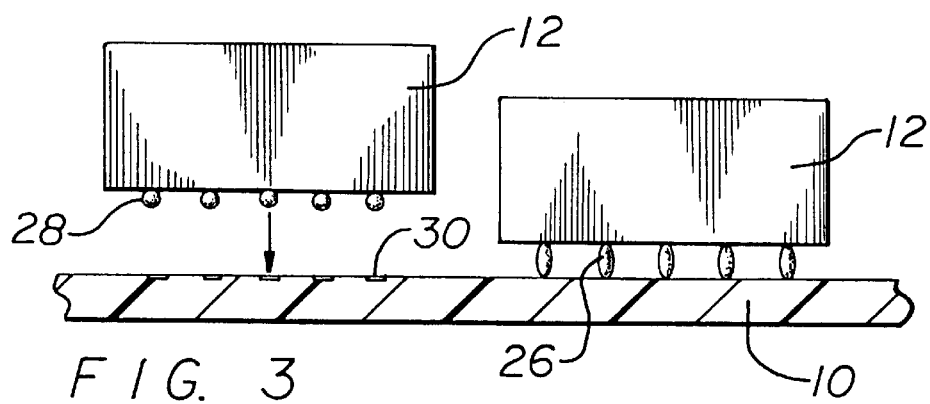
FIG. 3 is a side view showing an integrated circuit package mounted to the motherboard.

Referring to the drawings more particularly by reference numbers, FIGS. 1–3 show a printed circuit board 10 of the present invention. The printed circuit board 10 is typically a motherboard which supports a plurality of integrated circuit packages 12. The motherboard 10 has groups of solder pads 14 that are soldered to the packages 12 and coupled to routing traces 16. The routing traces 16 electrically connect the various packages 12 soldered to the board 10. In the preferred embodiment the motherboard 10 is constructed as a multi-layered printed circuit board which has routing traces 16 extending across the top surface of the board and an internal routing layer (not shown) which contains traces that extend across the board. The motherboard may also have internal power and ground busses as is known in the art. Some of the solder pads 14 are coupled to the internal layers of the board 10 by vias 18.

In the preferred embodiment, the solder pads 14 each have a diameter of 0.02 inches and are located on 0.05 inch centers. Some of the solder pads 14 are connected to routing traces 16 that extend along the top surface of the printed circuit board. The 0.02 inch diameter solder pads 14 allow two 0.006 inch wide routing traces 16 to be routed between the rows of pads 14 on the top surface of the board 10. The traces 16 are preferably separated by a dielectric space 20 of 0.006 inches.

Referring to FIG. 2, The top surface of the printed circuit board 10 preferably has a layer of solder mask 22. The solder mask 22 has a plurality of openings 24 that are concentric with the solder pads 14. The solder mask openings are preferably 0.024 inches in diameter. The vias 18 are preferably 0.014 inches in diameter and have an outer via pad that is 0.027 inches in diameter.

Referring to FIG. 1, in the preferred embodiment, each group of solder pads 14 is arranged to have an outer rectangular pattern which has five rows and five columns. The group 14 may also have an inner pattern 25 of solder pads 14 which are typically routed to the ground bus of the motherboard 10.

Providing two routing traces 16 that extend between adjacent solder pads 14 allows the pads 14 to be arranged into five rows with only one internal routing layer. The present invention thus provides a motherboard with a relatively large input/output (I/O) density without increasing the number of layers in the board. Minimizing the number of layers provides a circuit board that is relatively inexpensive to produce.

As shown in FIG. 3, an integrated circuit package 12 is soldered to the motherboard 10 by solder joints 26. The solder joints 26 are initially solder balls 28 that are solder to corresponding landing pads 30 of the integrated circuit package 12. The solder balls 28 are reflowed to create the solder points 26 after the package 12 is placed on the motherboard 10. The landing pads 30 are arranged in the same pattern as the solder pads 14 of the motherboard. The integrated circuit package therefore has five rows of solder balls having a pitch of 0.05 inches. In the preferred embodiment, the package has a bottom footprint of 27 by 27 millimeters (mm) and a total of 324 solder balls. This is to be distinguished from prior art 27 mm packages which have 241 solder balls. The present invention thus greatly increases the I/O of the package 12.

The solder balls of the integrated circuit package 12 are preferably 0.03 inches in diameter before being soldered to the motherboard 10. After the package is soldered to the circuit board the solder joints 26 typically have a height of approximately 0.02 inches and a width of approximately 0.037 inches. The 1:1 solder joint height to solder pad diameter ratio provides a relatively tall solder joint which has both shear and moment stress components when subjected to an external force.

Figure 4:
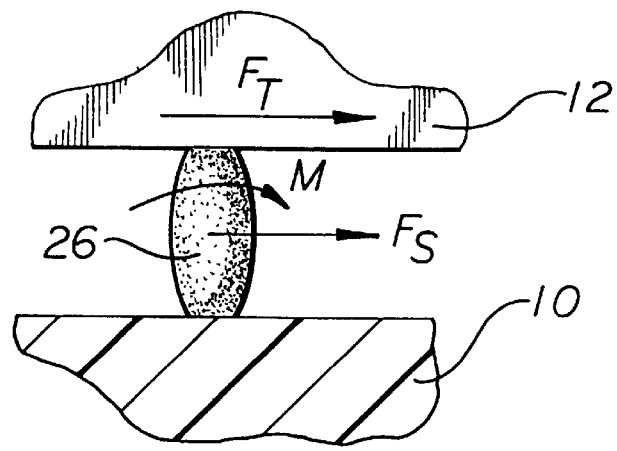
FIG. 4 is a static force diagram of a solder joint.

As shown in FIG. 4, each solder joint 26 may be subjected to an external force $F_T$. The force may be created by a differential thermal expansion between the integrated circuit package 12 and the motherboard 10. Alternatively, the force F may be applied by an external shock or vibration load. In addition to creating a shear load $F_S$ the force F will produce a moment M on the solder joint. Because the solder joint is relatively tall the moment component will be a larger percentage of the total stress than a shorter solder joint. The moment component typically has a lower magnitude, thus the total stress is lower per solder joint diameter. Thus the structural integrity of the solder joints is maintained even though the diameter of the solder pad is reduced by 20%.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A printed circuit board assembly, comprising:
   a printed circuit board which has a plurality of solder pads that each have a diameter;
   an integrated circuit package which has a plurality of landing pads; and,
   a plurality of solder joints that attach said landing pads to said solder pads, wherein said solder joints have a height that is approximately equal to said diameter of said solder pads.

2. The assembly as recited in claim 1, further comprising a plurality of lead traces that are located between two adjacent solder pads of said printed circuit board.

3. The assembly as recited in claim 2, wherein said diameter of each said solder pad is approximately 0.02 inches.

4. The assembly as recited in claim 3, wherein said solder pads have a pitch of approximately 0.05 inches.

5. The assembly as recited in claim 4, wherein said solder pads of said printed circuit board are arranged in a pattern that has five rows of solder pads.

6. The assembly as recited in claim 5, wherein said printed circuit board has a layer of solder mask which has a plurality of openings that are concentric with said solder pads and have a diameter of approximately 0.024 inches.

7. The assembly as recited in claim 1, wherein said solder pads of said printed circuit board are arranged in a pattern that has five rows of solder pads.

8. The assembly as recited in claim 1, wherein said diameter of each said solder pad is approximately 0.02 inches.

9. A method for assembling a printed circuit board assembly, comprising the steps of:
   a) providing a printed circuit board which has a plurality of solder pads, said solder pads each having a diameter;
   b) providing an integrated circuit package which has a plurality of solder balls that have a diameter that is approximately 1.5 times larger than said diameter of said solder pads; and,
   c) attaching said solder balls to said solder pads.

* * * * *